United States Patent [19]
Song et al.

[11] Patent Number: 5,770,888
[45] Date of Patent: Jun. 23, 1998

[54] INTEGRATED CHIP PACKAGE WITH REDUCED DIMENSIONS AND LEADS EXPOSED FROM THE TOP AND BOTTOM OF THE PACKAGE

[75] Inventors: Chi Jung Song, Daejon; Ju-Hwa Lee, Choongcheongbook-Do, both of Rep. of Korea

[73] Assignee: LG Semicon Co., Ltd., Cheongju, Rep. of Korea

[21] Appl. No.: 701,949

[22] Filed: Aug. 23, 1996

[30] Foreign Application Priority Data

Dec. 29, 1995 [KR] Rep. of Korea ............... 67335/1995

[51] Int. Cl.⁶ .................. H01L 23/48; H01L 23/495; H01L 23/52; H01L 23/02
[52] U.S. Cl. .................. 257/696; 257/676; 257/692; 257/686
[58] Field of Search .................. 257/676, 686, 257/692, 693, 696, 782, 3

[56] References Cited

U.S. PATENT DOCUMENTS

| | | |
|---|---|---|
| 4,857,989 | 8/1989 | Mori et al. .................. 257/782 |
| 5,157,480 | 10/1992 | McShane et al. .................. 257/693 |
| 5,214,307 | 5/1993 | Davis .................. 257/676 |
| 5,223,739 | 6/1993 | Katsumata et al. .................. 257/676 |
| 5,394,010 | 2/1995 | Tazawa et al. .................. 257/686 |
| 5,406,124 | 4/1995 | Morita et al. .................. 257/783 |
| 5,428,248 | 6/1995 | Cha .................. 257/676 |
| 5,436,500 | 7/1995 | Park et al. .................. 257/693 |
| 5,444,301 | 8/1995 | Song et al. .................. 257/737 |

FOREIGN PATENT DOCUMENTS

| | | | |
|---|---|---|---|
| 2673042 | 8/1992 | France .................. 257/686 |
| 60-89945 | 5/1985 | Japan .................. 257/684 |
| 62-23163 | 1/1987 | Japan .................. 257/782 |

*Primary Examiner*—Teresa M. Arroyo
*Attorney, Agent, or Firm*—Fleshner & Kim

[57] ABSTRACT

An improved package is thinner with increased memory capacity and improved heat emission effect. The package includes a plurality of leads, where each lead comprises a first connection lead and a second connection lead with upper and lower surfaces. An integrated chip, such as a semiconductor chip, is attached to a portion of the upper surface of the first connection lead. The chip and leads are molded such that the lower surface of the first connection leads and upper surface of the second connection leads are exposed.

35 Claims, 2 Drawing Sheets

INTEGRATED CHIP PACKAGE WITH REDUCED DIMENSIONS AND LEADS EXPOSED FROM THE TOP AND BOTTOM OF THE PACKAGE

TECHNICAL FIELD

The present invention relates to a semiconductor package, and more particularly, to a semiconductor package with predetermined portions of first and second surfaces of the leads are exposed.

BACKGROUND ART

FIG. 1 shows a lead-exposed semiconductor package described in U.S. Pat. No. 5,428,248, which has been assigned to LG Semicon, the assignee of this application. A semiconductor chip 11 is attached to an upper surface of a substrate connection lead 12a by adhesive members 13. A chip connection lead 12b extending from the substrate connection lead 12a has a predetermined height similar to the height of the upper surface of the semiconductor chip 11. A plurality of bond pads formed on the semiconductor chip 11 and the chip connection lead 12b are electrically connected to each other by a wire 14. A predetermined portion including the semiconductor chip 11 and a plurality of leads 12a and 12b are molded by resin, and a lower surface of the substrate connection lead 12a is exposed from a portion of the lower surface of the package and therefore electrically connected to a metallic pattern of a circuit substrate (not shown).

The conventional lead-exposed type semiconductor package is disadvantageous since the substrate connection leads are exposed toward the lower surface of the package, and it is not possible to stack a plurality of semiconductor chips, which restrict an increase of the memory capacity. In addition, it is not possible to achieve a desired heat emission effect, since the conventional lead-exposed type semiconductor package has a structure for emitting heat only toward the exposed substrate connection leads. Moreover, the thickness of the package is increased since a wire bonding is performed at an upper portion of the semiconductor chip, and a predetermined portion including the upper portion of the semiconductor is molded by resin.

DISCLOSURE OF THE INVENTION

Accordingly, it is an object of the present invention to provide a lead-exposed type semiconductor package which overcomes the above problems.

An advantage of the present invention is in providing a thinner lead-exposed type semiconductor package.

Another advantage of the present invention is in increasing the memory chip capacity of a semiconductor package.

Still another advantage of the invention is in improving the emission of heat generated by a semiconductor package in a package.

The above objects and advantages are achieved in part by a package for an integrated chip having a plurality of bonding pads, comprising: a lead frame having a plurality of leads with first and second surfaces, the first and second surfaces being opposing surfaces; means for attaching the integrated chip to a first predetermined portion of the first surface of the plurality of leads; means for coupling the plurality of bonding pads to the plurality of leads; and means for packaging the integrated chip, lead frame, attaching means and coupling means, wherein a second predetermined portion of the first surface and a first predetermined portion of the second surface of the plurality of leads are exposed.

The above objects and advantages are also achieved in part by a semiconductor package comprising: a semiconductor chip having a plurality of bonding pads; a lead frame having a plurality of leads with first and second surfaces, each lead having first and second connection leads, a first predetermined portion of the first surface of the second connection lead being parallel with a second predetermined portion of the second surface of the first connection lead; an adhesive attaching the semiconductor chip to the lead frame; a plurality of conductive members for connecting the plurality of bond pads to the plurality of leads; and a body member to package the semiconductor chip, lead frame, adhesive and conductive members, wherein the first and second predetermined portions are exposed.

To achieve the above objects, and advantages in accordance with an embodiment of the present invention, there is provided a semiconductor package, comprising: a semiconductor chip having a plurality of bond pads formed at a lower surface; a lead frame positioned at the lower surface of the semiconductor chip and including a plurality of leads, each lead having a first connection lead and a second connection lead; a plurality of adhesive members applied between the plurality of leads and the semiconductor chip for attaching the semiconductor chip to an upper surface of the first substrate connection leads; a plurality of wires, each wire connecting a corresponding bond pad of the semiconductor chip and a lower surface of a corresponding second connection lead; and a molded body for packaging the semiconductor chip and the first and second substrate connection leads, whereby a lower surface of the first connection leads and an upper surface of the second connection leads are exposed.

To achieve the above objects and advantages, in accordance with another embodiment of the present invention, there is provided a semiconductor package, comprising: a semiconductor chip having a plurality of bond pads formed at a lower surface; a lead frame positioned at the lower surface of the semiconductor chip and including a plurality of leads, each lead having a first connection lead and a second connection lead; a plurality of adhesive members applied between first substrate connection leads and the semiconductor chip to attach the semiconductor chip to an upper surface of the first connection leads; a plurality of solder bumps, each solder bump being formed on the upper surface of a corresponding first connection lead for connecting the corresponding first connection lead and a corresponding bond pad of the semiconductor chip; and a molded body for packaging the semiconductor chip and the first and second connection leads, whereby a lower surface of the first connection leads and an upper surface of the second connection leads are exposed.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
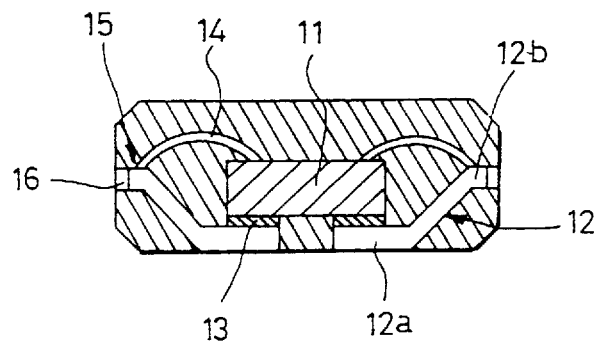
FIG. 1 is a cross-sectional view of a lead-exposed type semiconductor package described in U.S. Pat. No. 5,428,248.
Figure 2:
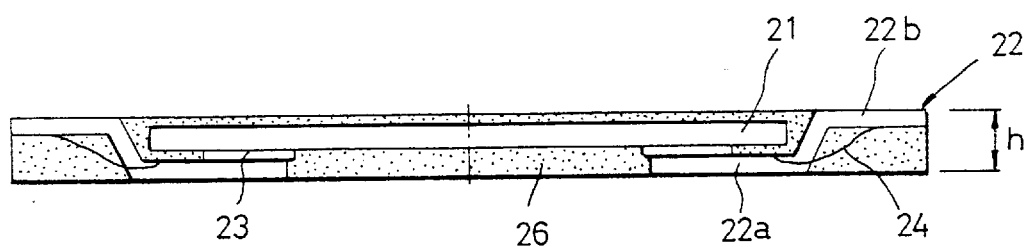
FIG. 2 is a cross-sectional view of a lead-exposed type semiconductor package according to an embodiment of the present invention.
Figure 3:
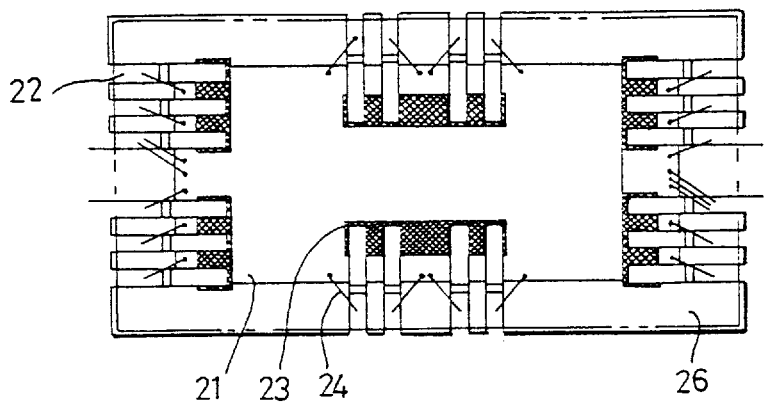
FIG. 3 is a bottom view of a lead-exposed type semiconductor package illustrated in FIG. 2.
Figure 5:
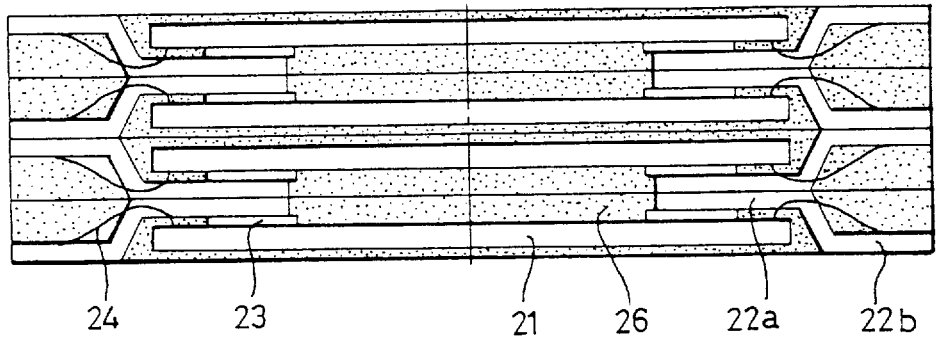
FIG. 5 is a cross-sectional view of the construction in which a semiconductor package of FIG. 2 is stacked to increase the integrated chip capacity according to the present invention.
Figure 6:
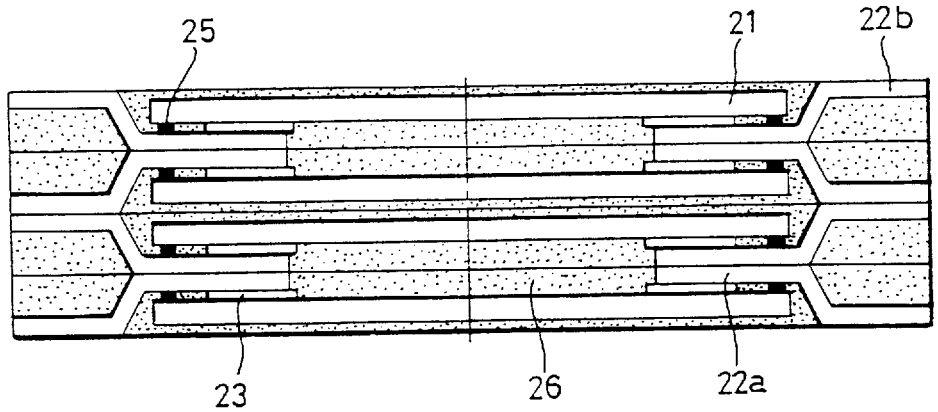
FIG. 6 is a cross-sectional view of the construction in which a semiconductor package of FIG. 4 is stacked to increase the integrated chip capacity according to the present invention.

FIG. 2 is a cross-sectional view of a lead-exposed type semiconductor package according to an embodiment of the present invention with FIG. 3 depicting the bottom view. A semiconductor chip 21 has a plurality of bond pads formed on the lower surface. A lead frame 22 is positioned at the lower portion of the semiconductor chip 21 and includes a plurality of leads. Each lead includes a first substrate connection lead 22a and a second substrate connection lead 22b. A predetermined length of the second substrate connection lead extends parallel with the first substrate connection lead 22a after being curved upwardly from one end of the first substrate connection lead 22a.

A plurality of adhesive members 23 is used to mount or attach a portion of the upper surface of the other end of the first substrate connection lead 22a and the semiconductor chip 21. The adhesive members 23 may be a two-sided insulation tape or an insulation paste adhesive based on polyamide or epoxy. A plurality of wires 24 electrically connect a plurality of bond pads on the lower surface of the semiconductor chip 21 to the lower surface of the second substrate connection leads 22b.

A molded body 26, made of resin, is formed using a molding process to package the semiconductor chip 21, the plurality of wires 24, the adhesive members 23, the upper surface of the first substrate connection leads 22a and the lower surface of the second substrate connection leads 22b. However, the lower surface of the first substrate connection leads 22a and the upper surface of the second substrate connection leads 22b are exposed and substantially co-planar with the outer surfaces of the molded body 26. As a result, the height from a lower surface of the first substrate connection leads 22a to an upper surface of the second substrate connection leads 22b is the thickness of the semiconductor package. The area of the exposed lower surface of the first substrate connection lead 22a may be similar to the area of the exposed upper surface of the second substrate connection lead 22b. Thereafter, the exposed lower surface of the first substrate connection lead 22a or the exposed upper surface of the second substrate connection lead 22b is connected to a metallic pattern of a printed circuit board (not shown).

Figure 4:
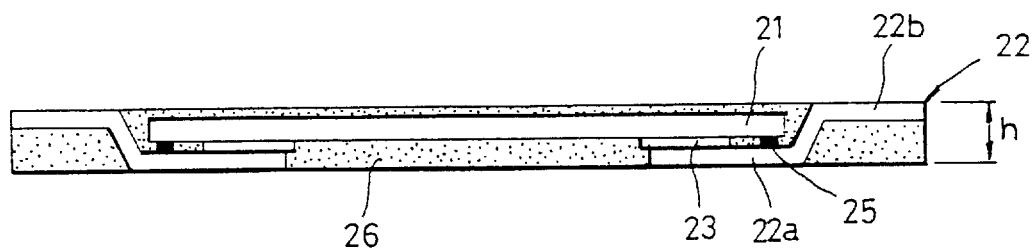
FIG. 4 is a cross-sectional view of a lead-exposed type semiconductor package according to another embodiment of the present invention.

FIG. 4 shows a cross-sectional view of a lead-exposed semiconductor package according to another embodiment of the present invention. The embodiment of FIG. 4 is similar to the embodiment of FIG. 2. Instead of a plurality of wires 24, a plurality of solder bumps 25 are used to connect the bond pads to the upper surface of the first substrate connection leads 22a.

The fabrication method of the lead-exposed type semiconductor package of the first and second embodiments according to the present invention is similar. In the FIG. 2 embodiment, the method includes a sawing step for separating the semicondcutor chip 21 from a wafer, a die bonding step for attaching the semiconductor chip 21 on the upper surface of the first substrate connection lead 22a using the adhesive members 23, a wire bonding step for connecting a plurality of bond pads of the semiconductor chip 21 and the substrate connection lead 22a using a metallic wire 24 such as gold or aluminum, and a molding step for packaging the wire-bonded semiconductor chip 21 and the substrate connection lead 22a using a molding resin so that the leads 22 can be partially exposed to the upper and lower surfaces of the package body. In the FIG. 4 embodiment, the wire bonding process is replaced with a soldering process. In both embodiments, the forming and trimming process is not required and the cost for fabricating the package.

As illustrated in FIGS. 2 and 4, the height of the package is reduced. Further, since the leads are exposed to the upper and lower surfaces of the semicondcutor package, the leads serve as a heat sink, whereby heat emission is improved, and reliability of the chip against heat damage can be enhanced. The compact size of the package can be readily achieved, and mounting of the chip can be performed more easily. It is also easy to perform an electric characteristic test, and thus enhancing electrical reliability.

In the foregoing embodiments, the surfaces were referred to as upper and lower surfaces for convenience to illustrate the present invention in view of the figures. As can be appreciate, the surface reference is dependent upon the orientation of the package. Further, the foregoing embodiment is merely exemplary and not to be construed as limiting the present invention. The description of the present invention is intended to be illustrative, and not limiting the scope of the claims. For example, FIGS. 2 and 4 embodiments illustrate the semiconductor chip which is encapsulated. However, one of ordinary skill in the art can readily package the chip with the top surface of the chip being exposed. Many alternatives, modifications and variations will be apparent to those skilled in the art.

We claim:

1. A package for an integrated chip having a plurality of bonding pads, comprising:

a plurality of leads each, having a first surface and a second surface, said first surface and second surface being opposing surfaces;

means for attaching said integrated chip to a first predetermined portion of said first surface of said leads;

means for coupling said bonding pads to said leads; and means for packaging the integrated chip, said leads, said attaching means and said coupling means, wherein said first surface and said second surface of said leads are exposed from a top surface and a bottom surface of said packaging means, respectively, and wherein said first and second surfaces are substantially co-planar with outer surfaces of said packaging means.

2. The package of claim 1, wherein said packaging means is a molded body made of resin.

3. The package of claim 2, wherein said molded body encapsulates the integrated chip.

4. The package of claim 2, wherein the integrated chip is partially molded by the molded body such that at least one surface of the integrated chip is exposed.

5. The package of claim 1, wherein each lead comprises a first connection lead and a second connection lead, said second connection lead being parallel with said first connection lead is bent from said first connection lead.

6. The package of claim 5, wherein the attaching means couples the integrated chip to the first surface of the first connection lead.

7. The package of claim 1, wherein said attaching means is at least one of double-sided insulation tape and insulation paste adhesive made from one of epoxy and polyamide.

8. The package of claim 1, wherein said coupling means comprises a plurality of wires.

9. The package of claim 1, wherein said coupling means comprises a plurality of solder bumps.

10. The package of claim 5, wherein the bond pad and the attaching means are over one surface of the integrated chip, and said coupling means is a plurality of wires, each wire connecting a corresponding bond pad of the integrated chip to the second surface of a corresponding second connection lead.

11. The package of claim 5, wherein said coupling means is a plurality of solder bumps, each solder bump connecting a corresponding bond pad of the integrated chip to the first surface of a corresponding first connection lead, wherein the bond pad and the attaching means are over one surface of the integrated chip.

12. A semiconductor package comprising:
a semiconductor chip having a plurality of bonding pads;
a plurality of leads with first and second opposing surfaces, each lead having first and second connection leads, a first predetermined portion of the first surface of the second connection lead being parallel with a second predetermined portion of the second surface of the first connection lead;
an adhesive attaching the semiconductor chip to said leads;
a plurality of conductive members for connecting said bonding pads to said leads; and
a body member to package said semiconductor chip, said leads, said adhesive and said conductive members, wherein said first and second surface of said leads are exposed from a top surface and a bottom surface of said body member, respectively, wherein said semiconductor chip is attached to the first surface of the first connection lead, and wherein each of said plurality of conductive members is connecting a corresponding bond pad on a lower surface of the semiconductor chip to the second surface of a corresponding second connection lead.

13. The semiconductor package of claim 12, wherein said first and second predetermined portions are substantially co-planar with outer surfaces of said body member.

14. The semiconductor package of claim 12, wherein said body member encapsulates said semiconductor chip.

15. The semiconductor package of claim 12, wherein said semiconductor chip is partially molded by the body member such that at least one surface of the semiconductor chip is exposed.

16. The semiconductor package of claim 12, wherein said second connection lead is parallel with said first connection lead, and bent from said first connection lead.

17. The semiconductor package of claim 12, wherein said adhesive is at least one of double-sided insulation tape and insulation paste adhesive made from one of epoxy and polyamide.

18. The semiconductor package of claim 12, wherein said plurality of conductive members is a plurality of wires.

19. The semiconductor package of claim 12, wherein said plurality of conductive members is a plurality of solder bumps, each solder bump connecting a corresponding bond pad on a lower surface of the semiconductor chip to the first surface of a corresponding first connection lead.

20. A semiconductor package comprising:
a semiconductor chip having a plurality of bond pads formed at a lower surface;
a plurality of leads positioned at the lower surface of the semiconductor chip, each lead having a first connection lead and a second connection lead;
a plurality of adhesive members applied between the leads and the semiconductor chip for attaching the lower surface of the semiconductor chip to an upper surface of the first connection leads;
means for connecting said bond pads to said leads;
a molded body for packaging the semiconductor chip, the first and second substrate connection leads, said adhesive members and connecting means, wherein a lower surface of the first connection leads and an upper surface of the second connection leads are exposed, and wherein said lower surface of said first connection leads and said upper surface of said second connection leads are substantially co-planar with outer surfaces of said molded body.

21. The semiconductor package of claim 20, wherein said adhesive members comprise at least one of a two-sided insulation tape and insulation paste adhesive made from epoxy or polyamide.

22. The semiconductor package of claim 20, wherein said second connection lead is parallel with the first connection lead, and curved from the first connection lead.

23. The semiconductor package of claim 20, wherein said semiconductor chip is partially molded by said molded body such that at least one surface of said semiconductor chip is encapsulated.

24. The semiconductor package of claim 20, wherein said lower surface of said first connection lead is exposed from a bottom surface of said molded body.

25. The semiconductor package of claim 24, wherein said upper surface of said second connection lead is exposed from a top surface of said molded body.

26. The semiconductor package of claim 20, wherein said connecting means is a plurality of wires, each wire connecting said bond pad to a lower surface of said second connection lead.

27. The semiconductor package of claim 20, wherein said connecting means is a plurality of solder bumps, each solder bump connecting said bond pad to an upper surface of said first connection lead.

28. A semiconductor package, comprising:
a semiconductor chip having a plurality of bond pads formed at a lower surface;
a plurality of leads positioned at the lower surface of the semiconductor chip, each lead having a first connection lead and a second connection lead, wherein the second connection lead is parallel with the first connection lead after being bent from an end of the first connection lead;
a plurality of adhesive members applied between said leads and the semiconductor chip to attach the lower surface of the semiconductor chip to an upper surface of the first connection leads;
means for connecting said bond pads to said leads, wherein said connecting means is a plurality of wires, each wire connecting said bond pad to a lower surface of said second connection lead; and
a molded body for packaging the semiconductor chip and the first and second connection leads.

29. The semiconductor package of claim 28, wherein said adhesive members comprise at least one of a two-sided insulation tape and insulation paste adhesive made from epoxy or polyamide.

30. The semiconductor package of claim 28, wherein said second connection lead is parallel with said first connection lead, curved from said first connection lead.

31. The semiconductor package of claim 28, wherein a lower surface of said first connection lead and an upper surface of said second connection leads are substantially co-planar with outer surfaces of said molded body.

32. The semiconductor package of claim 28, wherein a lower surface of said first connection lead and an upper surface of said second connection lead are exposed.

33. The semiconductor package of claim 28, wherein said connecting means is a plurality of solder bumps, each solder bump connecting said bond pad to an upper surface of said first connection lead.

34. The semiconductor package of claim 32, wherein said lower surface of said first connection lead is exposed from a bottom surface of said molded body.

35. The semiconductor package of claim 34, wherein said upper surface of said second connection lead is exposed from a top surface of said molded body. and wherein said first and second surfaces are substantially co-planar with outer surfaces of said packaging means.

\* \* \* \* \*